(12) United States Patent
MacLaren et al.

(10) Patent No.: US 6,517,375 B2
(45) Date of Patent: Feb. 11, 2003

(54) TECHNIQUE FOR IDENTIFYING MULTIPLE CIRCUIT COMPONENTS

(75) Inventors: John M. MacLaren, Cypress, TX (US); John Larson, Houston, TX (US)

(73) Assignee: Compaq Information Technologies Group, L.P., Houston, TX (US)

( * ) Notice: Subject to any disclaimer, the term of this patent is extended or adjusted under 35 U.S.C. 154(b) by 0 days.

(21) Appl. No.: 09/769,833

(22) Filed: Jan. 25, 2001

(65) Prior Publication Data

US 2001/0051457 A1 Dec. 13, 2001

Related U.S. Application Data

(60) Provisional application No. 60/177,826, filed on Jan. 25, 2000.

(51) Int. Cl.[7] .................................................. H01R 3/00
(52) U.S. Cl. ........................................ 439/489; 439/955
(58) Field of Search ................................ 439/489, 955, 439/43, 133, 488, 491, 93, 50, 510, 327, 328, 330; 361/1, 736; 307/140

(56) References Cited

U.S. PATENT DOCUMENTS

| | | | | |
|---|---|---|---|---|
| 3,191,095 A | * | 6/1965 | Hefti ........................... | 439/489 |
| 4,675,769 A | * | 6/1987 | Marshall et al. ............... | 361/1 |
| 5,203,004 A | * | 4/1993 | Bunton et al. ................. | 439/49 |
| 5,313,626 A | | 5/1994 | Jones et al. ................... | 395/575 |
| 5,331,646 A | | 7/1994 | Krueger et al. ............ | 371/40.1 |
| 5,367,669 A | | 11/1994 | Holland et al. ............. | 395/575 |
| 5,530,623 A | * | 6/1996 | Sanvo et al. ................. | 361/788 |
| 5,991,158 A | * | 11/1999 | Chan et al. .................. | 361/736 |
| 6,007,357 A | * | 12/1999 | Perino et al. ............... | 439/327 |
| 6,056,579 A | * | 5/2000 | Richards, III et al. ...... | 439/358 |
| 6,098,132 A | | 8/2000 | Olarig et al. ................ | 710/103 |
| 6,223,301 B1 | | 4/2001 | Santeler et al. ................. | 714/6 |

* cited by examiner

*Primary Examiner*—Neil Abrams
*Assistant Examiner*—J. F. Duverne
(74) *Attorney, Agent, or Firm*—Fletcher, Yoder & Van Someren

(57) ABSTRACT

A technique for identifying multiple circuit components. More specifically, a technique for identifying the location of electrical components, such as memory cartridges which have been disposed on a substrate, is described.

15 Claims, 4 Drawing Sheets

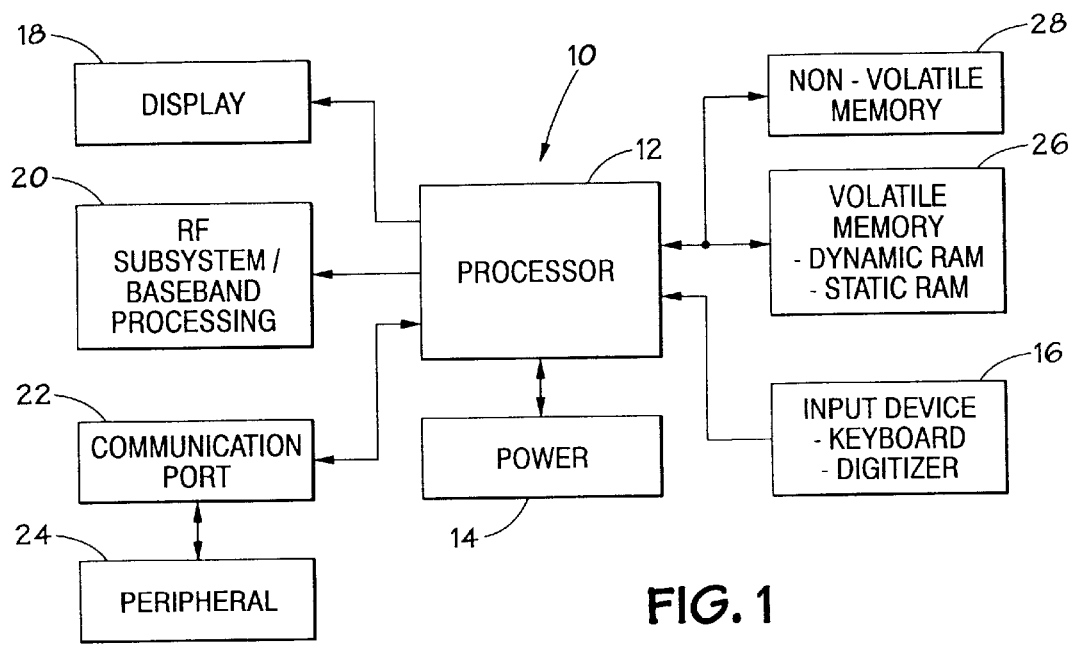
FIG. 1
FIG. 5A
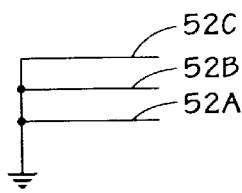
FIG. 5B
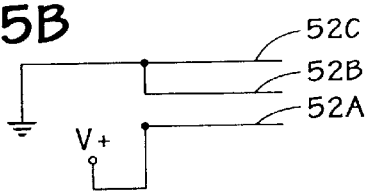
FIG. 5E
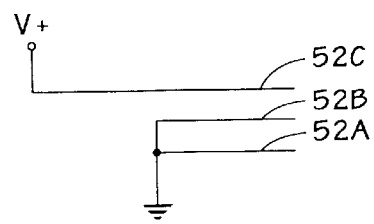
FIG. 5C
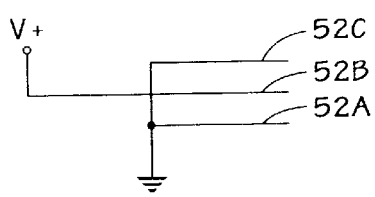
FIG. 5D
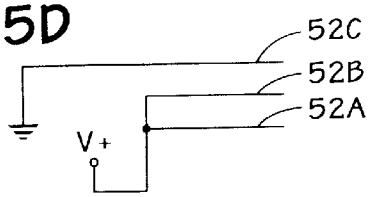

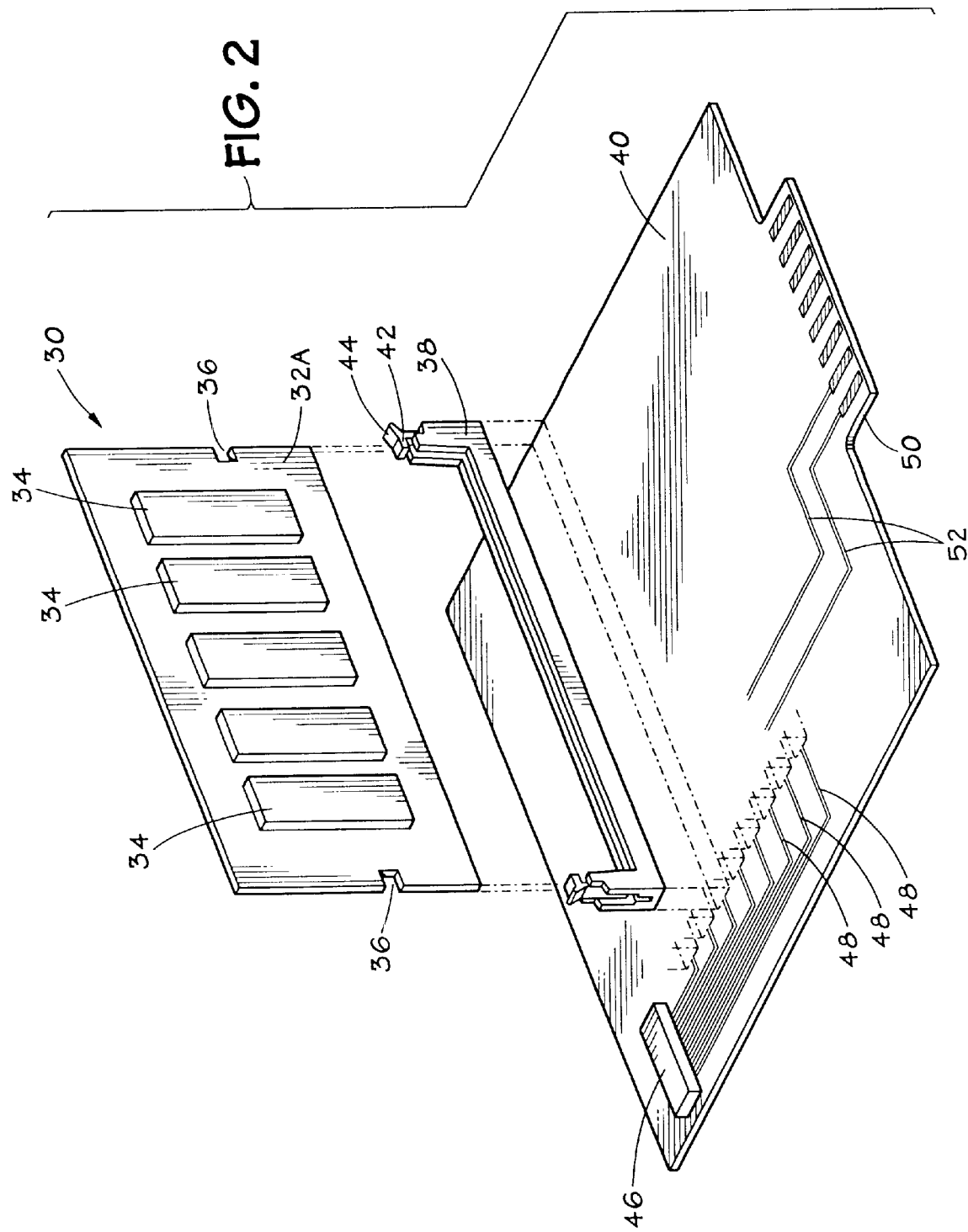

TECHNIQUE FOR IDENTIFYING MULTIPLE CIRCUIT COMPONENTS

CROSS-REFERENCE TO RELATED APPLICATION

The present application claims priority under 35 U.S.C §119(e) to provisional application Serial No. 60/177,826 filed on Jan. 25, 2000.

BACKGROUND OF THE INVENTION

1. Field of the Invention

The present invention relates generally to a technique for identifying multiple circuit components and, more particularly, to a technique for identifying the location of multiple memory modules.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-based systems generally incorporate a plurality of electrical components. Electrical components, such as control chips, processor chips and memory modules, are often mounted on a substrate such as a printed circuit board or a ceramic board. The substrates generally contain conductive traces which allow the electrical components to be electrically coupled to each other via the substrate. Aside from connecting the electrical devices to one another, the substrate often provides a means of routing electrical signals to and from the components on the substrate to other substrates or external components of the system.

For example, a computer system may include dozens of electrical devices, including memory devices. Several memory devices may be disposed on a single printed circuit board thereby creating a memory module or memory cartridge. The signals from the memory devices are routed to the edge of the printed circuit board so that the memory cartridge can be coupled to other system components. The memory cartridge may be electrically coupled to another substrate containing various other electrical components such as other memory devices, controllers, processors, or drivers, for instance. Furthermore, a plurality of memory cartridges may be mounted on a single printed circuit board thereby creating an array of memory cartridges.

Occasionally, when a system is running, one or more of the memory cartridges may fail. In this instance, it may be desirable to change the faulty memory cartridge. Further, it may be desirable to change the memory cartridge without powering down the entire system or disrupting normal operations. In the past, memory cartridges have been physically secured and electrically coupled to a substrate using solder or some other means of permanently attaching the memory cartridge to the substrate. This makes removal and replacement of the memory cartridges difficult. In other instances, the memory cartridge may be attached to the substrate by a connector which will permit removal of the memory cartridge. However, replacing the bad memory cartridge often requires powering the system down.

The present invention may address one or more of the problems set forth above.

SUMMARY OF THE INVENTION

Certain aspects commensurate in scope with the disclosed embodiments are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In one embodiment of the present invention, there is provided a system comprising a first substrate, a plurality of connectors, and a plurality of second substrates. The first substrate is configured to provide a plurality of unique identifiers corresponding to a plurality of locations on the first circuit board. The connectors are mounted on the first substrate in a variety of locations. Each connector has a unique identification device configured to receive a corresponding unique identifier. A second substrate is mounted on and electrically coupled to each of the connectors so that the unique identifier associated with each connector will also correspond to the second substrate.

According to another embodiment of the present invention, there is provided a system comprising a first substrate and a plurality of connectors. The plurality of connectors is mounted on the first substrate and configured to receive a plurality of second substrates. Each connector includes a plurality of unique identification devices configured to provide a unique identifier to the connector. Electrical signals are received by the first substrate and routed to the unique identification device on each connector, thereby providing a unique identifier for each connector and corresponding second substrate.

According to still another embodiment of the present invention, there is provided a method of identifying the location of a substrate in a system. A plurality of connectors is mounted on a first substrate. Each connector includes a plurality of pins which are electrically coupled to the first substrate. A logical signal is applied to each pin thereby providing a unique identifier for each connector. A second substrate is mounted on each connector and electrically coupled to each pin in the connector. A control device on each of the second substrates latches the logical signals from the connector to a chip on the substrate.

BRIEF DESCRIPTION OF THE DRAWINGS

The foregoing and other advantages of the invention will become apparent upon reading the following detailed description and upon reference to the drawings in which:

FIG. 1 illustrates a block diagram of an exemplary processor-based system in accordance with the present invention;

FIG. 2 illustrates a perspective view of a first substrate, such as a memory module, coupled to a second substrate using a connector configured in accordance with the present invention;

FIGS. 5A–5E illustrate different configurations of pin connectors to create unique cartridge identifiers in accordance with the present invention.

DETAILED DESCRIPTION OF SPECIFIC EMBODIMENTS

Figure 3:
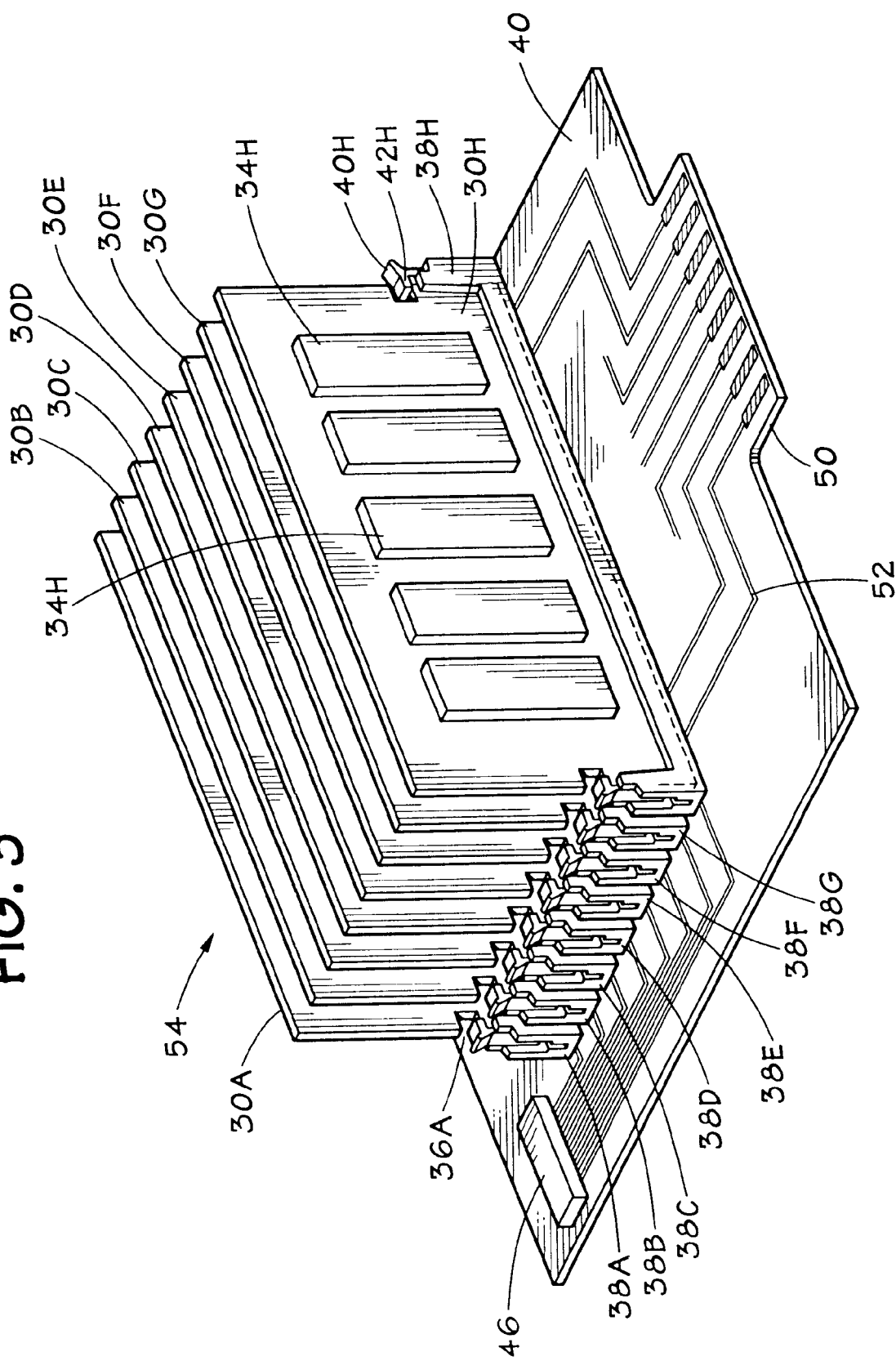
FIG. 3 illustrates a perspective view of eight substrates, such as memory modules, coupled to a substrate using connectors configured in accordance with the present invention.

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Turning now to the drawings, and referring initially to FIG. 1, a block diagram depicting an exemplary processor-based system, generally designated by the reference numeral 10, is illustrated. The system 10 may be any of a variety of different types, such as a computer, pager, cellular telephone, personal organizer, control circuit, etc. In a typical processor-based system, a processor 12, such as a microprocessor, controls many of the functions of the system 10.

The system 10 typically includes a power supply 14. For instance, if the system 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the system 10 may be plugged into a vehicle's cigarette lighter, for instance.

Various other devices may be coupled to the processor 12, depending upon the functions that the system 10 performs. For instance, a user interface 16 may be coupled to the processor 12. The user interface 16 may include buttons, switches, a keyboard, a light pin, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port 22 may be adapted to be coupled to a peripheral device 24, such as a modem, a printer, or a computer, for instance, or to a network, such as a local area network or the Internet.

Because the processor 12 controls the functioning of the system 10 generally under the control of software programming, memory is coupled to the processor 12 to store and facilitate execution of the program. For instance, the processor 12 may be coupled to volatile memory 26, which may include dynamic random access memory (DRAM) and/or static random access memory (SRAM). The processor 12 may also be coupled to non-volatile memory 28. The non-volatile memory 28 may include a read only memory (ROM), such as an EPROM or Flash-Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk or tape drive memory.

A variety of memory devices, such as DRAMS, SDRAMS, SRAMS, etc., can make up the volatile memory 26, and may be utilized in a system such as a computer system. Several memory devices may be configured to provide a single memory module, such as a SIMM or DIMM. A plurality of SIMMs may be coupled to a board to form a replaceable memory cartridge. The present embodiment may be particularly useful in providing unique identifiers for memory cartridges. In FIG. 2, a memory module 30 is illustrated. A memory module 30, in this case a SIMM, is generally a substrate, here a printed circuit board 32 with a plurality of memory chips 34, such as SDRAMs, mounted thereon. The printed circuit board 32 may have notches 36 along the edges. The notches 36 may be used to lock the memory module 30 into a connector 38, as discussed below.

The memory module 30 may be mounted on a second substrate such as a printed circuit board 40 for incorporation into a system. The memory module 30 may be configured to be installable into a module connector 38. The module connector 38 may be mounted on the printed circuit board 40. The module connector 38 not only provides electrical connections for the memory module 30 but also mechanically secures the memory module 30 to the printed circuit board 40. The printed circuit board 32 of the memory module 30 may be configured with small notches 36 along the edges. The clips 42 on the module connector 38 fit into the notches 36 to hold the memory module 30 securely within the module connector 38. Each clip 42 may have a thumb release 44, for example, which removes the clips 42 from their corresponding notches 36 to allow the memory module 30 to be easily removed from the module connector 38. A controller 46 may be mounted on the printed circuit board 40 and electrically coupled to the memory module 30 through conductive traces 48 on the printed circuit board 40. Further, the memory module 30 may be electrically coupled to the edge connector 50 via conductive traces 52. The edge connector 50 may be configured to be insertable into a cartridge connector for incorporation into a system, as further discussed with reference to FIGS. 3–5.

FIG. 3 illustrates a memory cartridge 54. For the sake of clarity, elements similar to the elements previously described will be designated by like reference numerals. According to one embodiment, a printed circuit board 40A may be configured to receive a plurality of connectors and/or modules, such as eight module connectors 38A–H and eight memory modules 30A–H.

Each module connector 38A–H may contain pins (not shown) to provide a signal path from each of the eight module 30A–H to the edge connector 50 via conductive traces 52 for incorporation into a system.

It may be advantageous to know the location of a particular memory cartridge 54 within a system 10 (FIG. 1). In this instance, it is desirable to have a memory cartridge identifier which allows each memory cartridge 54 to be identified based on its location in the system array. The unique identifier may be important because it not only may be used to identify a cartridge 54 in the system to ensure accurate memory operation, but it also allows easy identification of a failed memory cartridge 54 so that it can be replaced. Further, in lock-step systems, a memory cartridge 54 may advantageously be identified to ensure that the controller on each cartridge 54 is able to identify itself as the recipient of a WRITE broadcast, or if the broadcast receipt is simply to keep system synchronization and can thereby be ignored. A WRITE broadcast includes a cartridge identifier to indicate which memory cartridge 54A–E (FIG. 4) should receive the data. However, to ensure that each of the cartridges 54A–E remain synchronized, the broadcast is sent to each cartridge 54A–E. Each memory cartridge 54A–E can compare its own cartridge identifier with the identifier included in the WRITE broadcast. If the identifiers match, the memory cartridge 54A–E will write the data to the appropriate location. If the identifiers do not match, the WRITE broadcast is ignored. Cartridge identification also allows a memory cartridge 54A–E to know its unique identification so that it knows if the system is trying to access that memory cartridge. Thus, if there are specific operations that should be performed by a single memory cartridge (extra operations performed as a result of a hot-plug operation, for example) the cartridge identifier will allow the cartridge 54A–E to identify itself as the cartridge 54A–E that should perform those specific operations. Conversely, the unique identifier will allow a system to identify a cartridge failure. This concept is further explained with reference to FIG. 4, below.

Figure 4:
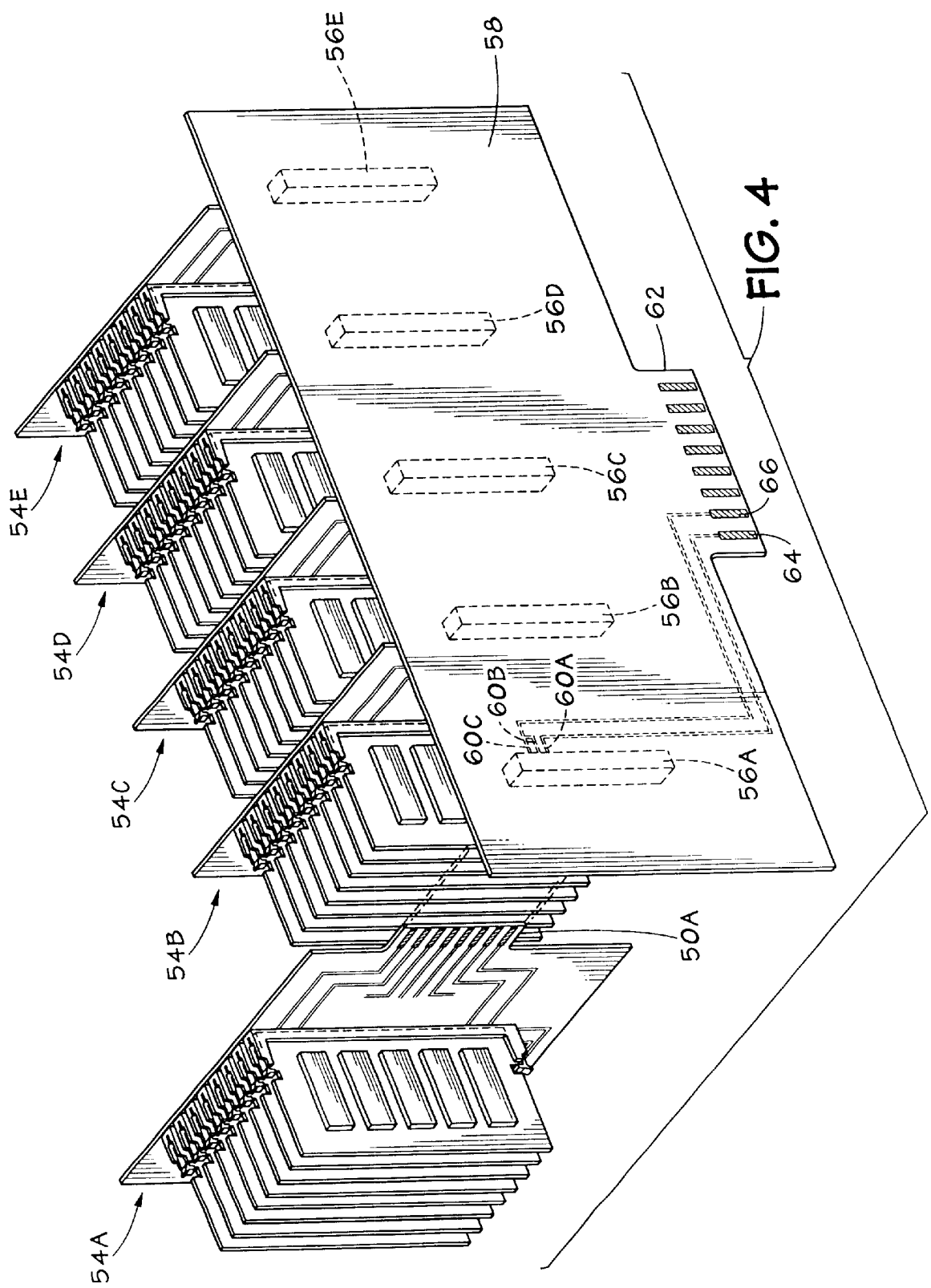
FIG. 4 illustrates a bank of memory cartridges having cartridge connectors in accordance with the present invention.

FIG. 4 illustrates an exemplary embodiment of memory cartridges as they might be incorporated into a system. In this embodiment, the unique identifier is implemented using a set of contacts (not shown) located on each cartridge connector 56A–E. The contacts are configured to align with pads or receptacles on a printed circuit board, such as motherboard 58. The pads or receptacles are coupled to conductive traces 60A–C which may be routed to an edge connector 62 on the motherboard 58 to allow for incorporation into a system, such as the system 10 illustrated in FIG. 1. The conductive traces 60A–C are electrically coupled to a logical signal through each module edge connector 50 (illustrated in FIG. 3). The conductive traces 60A–C may be tied to a logical high voltage source such as a 3.3 volt source or to a logical low such as ground. Thus, in this exemplary embodiment, five unique identifiers may be provided using three contacts in each cartridge connector 56A–E. When a memory cartridge 54A–E is inserted into a cartridge connector 56A–E, the contacts in the cartridge connector 56A–E provide an electrical path from the edge connector 62 to the memory controller 46 (FIG. 3) on each memory cartridge 54A–E.

By providing logical signals from the memory cartridges 54A–E to the cartridge connectors 56A–E and electrically coupling the contacts on the memory cartridges 54A–E to pads or receptacles located on the motherboard 58, a unique identifier for each memory cartridge 54A–E can be provided to the system. The pads or receptacles are electrically coupled to the memory controllers 46 (FIG. 3) located on each memory cartridge 54A–E through the module edge connector 50A–E. The logical signals may be latched by the memory controllers 46 on the memory cartridges 54A–E at reset, for example, to provide each memory cartridge 54A–E with a unique identifier.

As an example, assume that the input 64 receives a logical high signal, such as a 3.3 volt signal, and the input 66 receives a logical low signal, such as ground. The conductive traces 60A–C which are coupled to the inputs 64 and 66 will transmit a logical high or low depending on the particular configuration of the conductive traces 60A–C. In this particular example, the first trace 60A receives a logical high, while the second and third traces 60B and 60C receive a logical low, as illustrated in FIG. 4. Thus, in this example the unique identifier for the cartridge connector 56A is a binary 100 (4 Hex).

It should be appreciated that while the discussion of the present embodiment has illustrated a system wherein traces carrying like logical signals are electrically coupled on the motherboard 58, the contacts carrying the unique identifiers may be physically coupled within the cartridge connector 56A. Referring again to FIG. 4, the unique cartridge identifier 100 is illustrated. Here, the second and third traces 60B and 60C on the cartridge connector 56A receive a logical low signal from input 66. As illustrated, a single trace extends from the input 66 and splits before arriving at the cartridge connector 56A. Alternatively, the second and third contacts in the connector cartridge 56A aligning with the traces 60B and 60C may be electrically coupled on the cartridge connector 56A thus making it unnecessary to route a conductive trace 60B to the contact currently corresponding to the trace 60B on the motherboard 62.

The different configurations of traces to create the unique cartridge identifiers in accordance with the embodiment discussed in FIG. 4 are illustrated in FIGS. 5A–5E. Thus, FIG. 5E provides the unique cartridge identifier correlating with memory cartridge 54A (illustrated in FIG. 4). The configuration illustrated in FIG. 5A, corresponding to the cartridge connector 56E shows each of the three traces tied to a ground signal thus creating the unique identifier 000. FIG. 5B, corresponding to cartridge connector 56D, illustrates the configuration used to provide the unique cartridge identifier 001. Here, the first two traces are tied to ground and the third trace is tied to a logical high signal. FIG. 5C, corresponding to cartridge connector 56C, illustrates the configuration used to provide the unique cartridge identifier 010. Here, the first and third traces are tied to ground while the second trace is tied to a logical high. FIG. 5D, corresponding with cartridge connector 56B illustrates the configuration used to provide the unique cartridge identifier 011. Here, the first trace is tied to ground while the second and third traces are tied to a logical high. FIG. 5E, corresponding to cartridge connector 56A, illustrates the configuration used to provide the unique cartridge identifier 100, as previously discussed. Here, the first trace is tied to a logical high, while the second and third traces are tied to ground.

While the present system illustrates five memory cartridges 54A–54E, it should be evident that the present identification scheme using three contacts provides identification capabilities for up to eight memory cartridges (corresponding to binary 101, 110, and 111). Further, while three-bit identifiers have been illustrated in this embodiment, it should be clear that fewer or more contacts may be used to provide unique identifiers depending upon the number of cartridges to be identified. Cartridge connectors may be arranged in an array of rows and columns such that the unique identifier provides the row and column location necessary for memory cartridge identification.

Further, using the same technique, it may be advantageous to provide an identification scheme for each memory module in a memory cartridge. Thus, it is possible to use the same identification technique that was used to provide memory cartridge 54A–E identification by using traces 60A–C on the motherboard 58 to provide memory module 30A–H identification. The module connectors 38A–H may be contain contacts which correspond to traces on the printed circuit board 40. This provides an array identification scheme which may be useful in some applications.

The address location provided by the unique identifier provides location information which may be useful if a memory cartridge fails. The memory controller 46 mounted on each memory cartridge 54A–E, as shown in FIGS. 3 and 4, may be configured to send an error response to the system when a failure is detected. Because the memory controller 46 has latched the unique identifier from the cartridge connector 56A–E, the memory controller 46 is configured to deliver the unique identifier along with an error message to an overall system controller, for example, which will indicate that a failure has occurred and provide the location of the failed memory cartridge. This information may be particularly useful in a system which allows a hot plug replacement of the memory cartridges 54A–E. By knowing the exact location of the memory cartridge failure, it may be unnecessary to power down the system to replace the failed memory cartridge 54A–E.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system comprising:
a first substrate configured to provide a plurality of unique identifiers corresponding to a plurality of locations on the first substrate;
a plurality of connectors coupled to the first substrate at the plurality of locations, each connector comprising a unique identification device configured to receive the corresponding unique identifier wherein each unique identification device comprises three contacts configurable to be coupled to one of a logical high signal and a logical low signal; and
a plurality of second substrates, each second substrate coupled to a corresponding connector such that the unique identification device couples the corresponding unique identifier to the second substrate.

2. The system, as set forth in claim 1, wherein the first substrate is configured to receive five connectors.

3. The system, as set forth in claim 1, wherein each connector comprises a memory cartridge connector.

4. The system, as set forth in claim 1, wherein the first substrate is configured to receive an array of connectors arranged in a plurality of rows and columns.

5. The system, as set forth in claim 4, wherein each connector comprises a memory cartridge connector.

6. The system, as set forth in claim 1, wherein the unique identifier represents a physical location of the corresponding connector with respect to the first substrate.

7. The system, as set forth in claim 1, wherein the unique identifier represents an electrical location of the corresponding connector with respect to the first substrate.

8. The system, as set forth in claim 1, wherein each of the plurality of second substrates comprises a plurality of memory modules.

9. The system, as set forth in claim 8, wherein each of the plurality of memory modules comprises a plurality of memory devices.

10. The system, as set forth in claim 8, wherein each of the plurality of second substrates comprises a memory controller.

11. A system comprising:
a first substrate; and
a plurality of connectors coupled to the first substrate and configured to receive a plurality of second substrates, each connector comprising a plurality of unique identification devices configured to electrically couple a plurality of electrical signals representative of a unique identifier to a corresponding second substrate, the electrical signals being received from the first substrate and the unique identifier representing a location of the corresponding connector on the first substrate, and wherein each unique identification device comprises three contacts configurable to be coupled to one of a logical high signal and a logical low signal.

12. The system, as set forth in claim 11, wherein the first printed circuit board is configured to receive five connectors.

13. The system, as set forth in claim 11, wherein each connector comprises a memory cartridge connector.

14. The system, as set forth in claim 11, wherein the first substrate is configured to receive an array of connectors arranged in a plurality of rows and columns.

15. The system, as set forth in claim 14, wherein each connector comprises a memory cartridge connector.

* * * * *